US012804934B2

(12) United States Patent
Wang et al.

(10) Patent No.: US 12,804,934 B2
(45) Date of Patent: Nov. 17, 2026

(54) METHOD FOR MANUFACTURING TRENCH-TYPE MOSFET

(71) Applicant: Hangzhou Silicon-Magic Semiconductor Technology Co., Ltd., Hangzhou City (CN)

(72) Inventors: Jiakun Wang, Hangzhou City (CN); Zhaoming Yao, Hangzhou City (CN)

(73) Assignee: Silicon-Magic Semiconductor Technology (Hangzhou) Co., Ltd., Hangzhou (CN)

( * ) Notice: Subject to any disclaimer, the term of this patent is extended or adjusted under 35 U.S.C. 154(b) by 830 days.

(21) Appl. No.: 18/299,245

(22) Filed: Apr. 12, 2023

(65) Prior Publication Data

US 2023/0335621 A1 Oct. 19, 2023

(30) Foreign Application Priority Data

Apr. 13, 2022 (CN) ......................... 202210380606.7

(51) Int. Cl.
*H10D 30/01* (2025.01)
*H10D 30/66* (2025.01)
*H10D 64/00* (2025.01)

(52) U.S. Cl.
CPC ....... *H10D 30/0297* (2025.01); *H10D 30/668* (2025.01); *H10D 64/117* (2025.01)

(58) Field of Classification Search
CPC . H10D 30/0297; H10D 30/668; H10D 64/117
See application file for complete search history.

(56) References Cited

U.S. PATENT DOCUMENTS

| | | | | |
|---|---|---|---|---|
| 7,998,808 B2 * | 8/2011 | Viswanathan | ..... | H10D 30/0295 257/E21.549 |
| 8,497,549 B2 * | 7/2013 | Madson | ............. | H10D 30/0297 257/330 |

(Continued)

FOREIGN PATENT DOCUMENTS

| | | |
|---|---|---|
| CN | 102656696 A | 9/2012 |
| CN | 105118775 A | 12/2015 |

(Continued)

OTHER PUBLICATIONS

First Office Action, including Search Report, for Chinese Patent Application No. 202210380606.7, dated May 31, 2022, 13 pages.

(Continued)

*Primary Examiner* — Joseph C. Nicely
(74) *Attorney, Agent, or Firm* — Westman, Champlin & Koehler, P.A.

(57) ABSTRACT

Disclosed is a method for manufacturing a trench-type MOSFET, which comprises: providing a semiconductor structure, forming a trench in the semiconductor structure; forming a side oxide layer and dielectric layer in the trench; forming a shielding conductor in the trench; removing the hard mask; performing wet etching to remove the side oxide layer and dielectric layer; depositing an oxide layer from above the trench; etching the oxide layer to make an upper surface of the oxide layer lower than that of the shielding conductor; forming a gate dielectric layer and a gate conductor on the oxide layer, wherein the gate dielectric layer is located on an upper-portion side wall of the trench and separates the gate conductor from the semiconductor structure. By improving gate poly morphology, figure of merit of the device is optimized.

12 Claims, 12 Drawing Sheets

(56) References Cited

U.S. PATENT DOCUMENTS

| | | | | | |
|---|---|---|---|---|---|
| 8,748,976 | B1 * | 6/2014 | Kocon | H10D 30/0297 257/330 |
| 9,419,129 | B2 | 8/2016 | Gao et al. | |
| 9,653,560 | B1 * | 5/2017 | Liu | H10D 64/513 |
| 9,893,168 | B2 | 2/2018 | Gao et al. | |
| 10,510,878 | B1 * | 12/2019 | Chien | H01L 21/765 |
| 2011/0089485 | A1 | 4/2011 | Gao et al. | |
| 2012/0235229 | A1 * | 9/2012 | Probst | H10D 64/01 257/330 |
| 2013/0062688 | A1 | 3/2013 | Kobayashi | |
| 2014/0284773 | A1 * | 9/2014 | Nishiguchi | H10D 64/117 438/597 |
| 2016/0043192 | A1 * | 2/2016 | Ding | H10D 64/513 438/270 |
| 2016/0163805 | A1 * | 6/2016 | Lee | H10D 62/103 438/270 |
| 2016/0359018 | A1 | 12/2016 | Gao et al. | |
| 2021/0119038 | A1 * | 4/2021 | Yang | H10D 64/685 |
| 2021/0351289 | A1 * | 11/2021 | Hsieh | H10D 30/668 |
| 2022/0052176 | A1 | 2/2022 | Chen et al. | |
| 2022/0208601 | A1 * | 6/2022 | Yang | H10D 64/112 |

FOREIGN PATENT DOCUMENTS

| | | | | | |
|---|---|---|---|---|---|
| CN | 105355560 | A | * | 2/2016 | H10D 30/0297 |
| CN | 105118775 | B | * | 2/2019 | H01L 21/28035 |
| CN | 208655650 | U | * | 3/2019 | |
| CN | 110061049 | A | * | 7/2019 | H10D 30/668 |
| CN | 113224151 | A | | 8/2021 | |
| CN | 113782449 | A | * | 12/2021 | H10D 30/668 |
| CN | 114005756 | A | * | 2/2022 | H10D 30/025 |
| CN | 114496762 | A | | 5/2022 | |
| CN | 115810546 | A | * | 3/2023 | |
| EP | 2472573 | A1 | * | 7/2012 | H10D 64/117 |
| TW | 202213540 | A | | 4/2022 | |

OTHER PUBLICATIONS

Second Office Action, including Search Report, for Chinese Patent Application No. 202210380606.7, dated Jun. 30, 2022, 14 pages.

Third Office Action, including Search Report, for Chinese Patent Application No. 202210380606.7, dated Aug. 9, 2022, 14 pages.

* cited by examiner

METHOD FOR MANUFACTURING TRENCH-TYPE MOSFET

CROSS-REFERENCE TO RELATED APPLICATIONS

The present application claims priority to Chinese Patent Application No. 202210380606.7 filed on Apr. 13, 2022, entitled by "METHOD FOR MANUFACTURING TRENCH-TYPE MOSFET", and published as CN114496762A on May 13, 2022, which is incorporated herein by reference in its entirety.

FIELD OF TECHNOLOGY

The present disclosure relates to a semiconductor technology, and more particularly, to a method for manufacturing a trench-type MOSFET.

BACKGROUND

Since a split gate device structure has been proposed, split gate trench (SGT) transistor is widely applied due to its low specific on-resistance and low gate-drain coupling capacitance. Agate structure of the SGT transistor comprises a control gate and a split gate formed in a trench. The split gate can be used as an internal field plate to assist the depletion of a drift region to optimize electric field distribution of the device and optimize breakdown voltage and specific on-resistance, and can also play a role in achieving shielding effect, reducing an overlapped area of a gate electrode and a drain electrode, and reducing gate capacitance and gate charge. With the development of modern manufacturing technologies, design requirements of power semiconductor devices are continuously increased, and device design is developing towards miniaturization and high energy density. Miniaturization process of trench-type MOS devices faces problems of optimizing on-resistance and capacitance parameters of the devices, and a split gate structure is one of the technologies for improvement.

In terms of manufacturing process of a trench-type MOS device, an oxide layer has an extremely important function since it is used as a gate oxide layer of the MOS transistor, a protective film of a joint portion of a PN junction, and a photomask for impurity diffusion. Typical examples for manufacturing the oxide layer comprise: thermal oxidation method, chemical vapor deposition (CVD) method. The thermal oxidation method is to perform oxidation to a surface of a silicon wafer with high temperature oxygen or water vapor. Because a fine oxide layer can be formed, it is used as a gate oxide layer and a passivation layer (or passivation film) of the MOS transistor. However, the thickness at different positions of the oxide layer of the trench-type MOS device manufactured by this method has larger difference. Chemical vapor deposition (CVD) is a method to deposit silicon oxide on the surface of the wafer by chemical reaction with silane gas ($SiH_4$) and oxygen gas in a high-temperature reaction furnace. The main purpose of CVD is to form an insulating film between wiring layers, a passivation film to protect a surface of a chip, and the like, but the formed oxide layer has poor quality.

In addition, there is a manufacturing method combining thermal oxidation method and vapor phase growth method, as shown in a trench-type MOSFET 1 of FIG. 1, in which a source electrode (Source), a doped region of N type (N+ doped region), a doped region of P type (P+ doped region), a body region (Body), a gate conductor 18, a source poly, an epitaxial semiconductor layer (EPI) and a drain electrode (Drain) are arranged from top to bottom in the figure. The trench-type MOSFET 1 is formed with a side oxide layer by the thermal oxide method and the vapor phase growth method, and then the side oxide layer is subjected to wet etching and polysilicon is deposited to form a gate poly. Because the oxide layer formed by thermal chemical vapor deposition (thermal CVD) has differences, bottom of the oxide layer is not uniformly etched, a spike may be formed, and the gate conductor 18 shown in the figure is finally formed after polysilicon is deposited, leading to high gate capacitance of the device. Densification method can be adopted to improve the quality of the oxide layer, so as to allow the side oxide layer formed by wet etching to have better appearance, however, for some high-voltage or deep-trench devices, the above methods will increase the risk of device warpage.

To sum up, there is a need to provide a novel method for manufacturing a trench-type MOSFET device to provide a different gate conductor, in order to solve the above problems.

SUMMARY

In view of the above problems, an embodiment of the present disclosure adopts a novel method for manufacturing a MOSFET, which can well solve problems in the prior art.

Specifically, an embodiment of the present disclosure discloses a method for manufacturing a trench-type MOSFET, and the method comprises: providing a semiconductor structure, depositing a hard mask and performing etching to form a trench extending from an upper surface of the semiconductor structure to an interior of the semiconductor structure; forming a side oxide layer and a dielectric layer in the trench; forming a shielding conductor in the trench, wherein the side oxide layer and the dielectric layer separate the shielding conductor from the semiconductor structure; removing the hard mask; performing wet etching to remove a portion, which is located at an upper portion of the trench, of the side oxide layer and the dielectric layer; depositing an oxide layer from above the trench, wherein the oxide layer covers the side oxide layer and the dielectric layer, and the oxide layer is adjacent to the shielding conductor; etching the oxide layer so as to make an upper surface of the oxide layer lower than an upper surface of the shielding conductor; forming a gate dielectric layer and a gate conductor on the oxide layer in the trench, wherein the gate dielectric layer is located on an upper-portion side wall of the trench and separates the gate conductor from the semiconductor structure; and forming a body region, a source region and a drain electrode based on the semiconductor structure.

Optionally, in some embodiments of the present disclosure, the step of forming the side oxide layer in the trench comprises: forming the side oxide layer by thermal oxidation and forming the dielectric layer by chemical vapor deposition.

Optionally, in some embodiments of the present disclosure, before the step of forming a shielding conductor in the trench, the method further comprises: after forming the side oxide layer and the dielectric layer, performing a rapid thermal annealing process, and then depositing polysilicon as the shielding conductor.

Optionally, in some embodiments of the present disclosure, the step of removing the hard mask comprises: performing chemical mechanical planarization to remove the hard mask.

Optionally, in some embodiments of the present disclosure, the semiconductor structure comprises a semiconductor substrate layer and an epitaxial semiconductor layer on the semiconductor substrate layer, wherein the trench is located in the epitaxial semiconductor layer.

Optionally, in some embodiments of the present disclosure, the shielding conductor and the gate conductor are polysilicon layers formed by low-pressure chemical vapor deposition.

Optionally, in some embodiments of the present disclosure, the gate dielectric layer is an oxide layer formed by thermal oxidation.

Optionally, in some embodiments of the present disclosure, the source region is formed in the body region and is of a first dopant type; the body region is formed in an upper portion, which is adjacent to the trench, of the semiconductor structure and is of a second dopant type, wherein the second dopant type is opposite to the first dopant type, wherein the first dopant type is one of N type and P type, and the second dopant type is the other one of N type and P type; and the drain electrode is formed on a second surface of the semiconductor structure, and the second surface and the upper surface of the semiconductor structure are opposite to each other.

Optionally, in some embodiments of the present disclosure, after forming the source region, the method further comprises: forming an interlayer dielectric layer on the source region; and forming a source electrode on the interlayer dielectric layer.

Optionally, in some embodiments of the present disclosure, before forming the source electrode, the method further comprises: forming, in the body region, a body contact region of the second dopant type, and forming a conductive channel penetrating through the interlayer dielectric layer and the source region to reach the body contact region, wherein the source electrode is connected to the body contact region via the conductive channel.

To sum up, according to the disclosure, in view of process deficiencies of the prior art, morphology of the gate poly can be improved and the Figure of Merit (FOM) of the device can be optimized by depositing and smoothing the oxide layer after the side oxide layer is formed by wet etching. FOM plays an important role in measuring product performance, and the higher a FOM value of a product is, the better the performance is. The present disclosure effectively solves problems in the prior art through a novel solution according to embodiments of the present disclosure, and in addition, the embodiments of the present disclosure are provided without increasing too much cost, so as to meet economic efficiency requirement.

BRIEF DESCRIPTION OF THE DRAWINGS

In order to explain the technical solutions in the embodiments of the disclosure more clearly, the drawings needed in the embodiment description will be briefly introduced below. Apparently, the drawings described below are merely some of embodiments of the disclosure, and for those skilled in the art, other drawings can be obtained according to these drawings without any creative effort.

DESCRIPTION OF THE EMBODIMENTS

Figure 1:
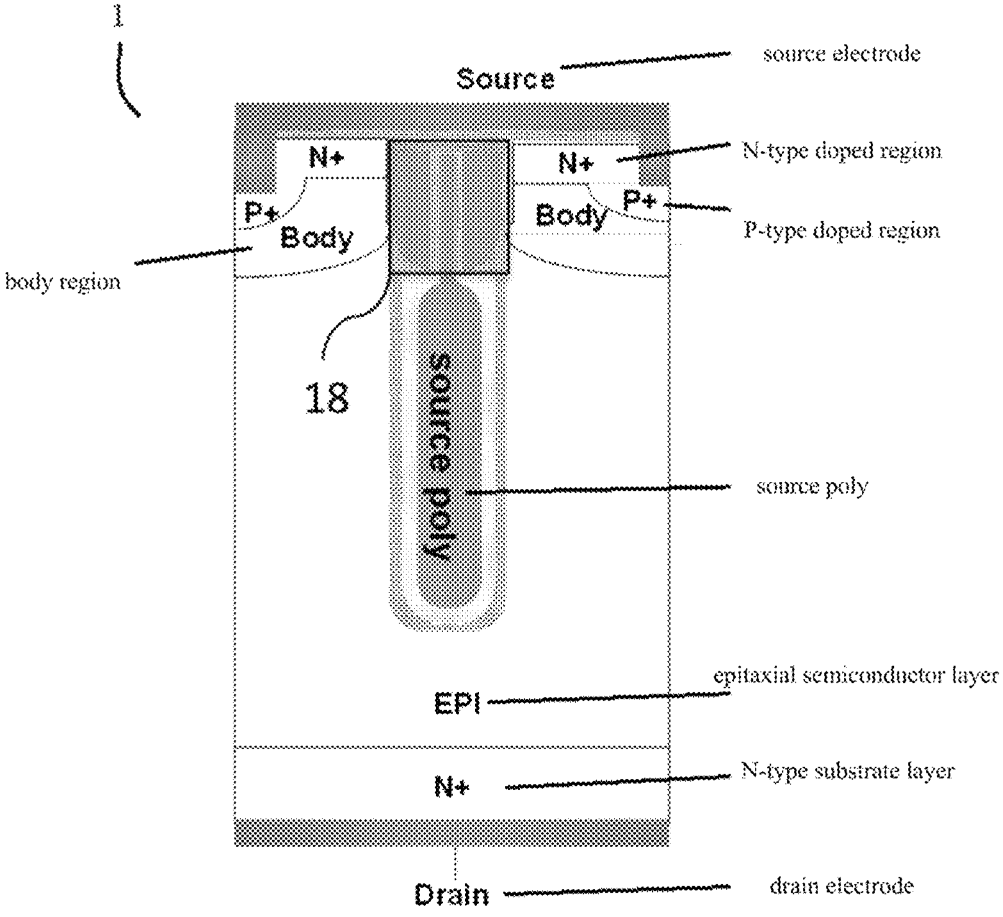
FIG. 1 shows a cross-sectional view of a trench-type MOSFET according to the prior art.

The following examples are provided for illustration only, various changes and modifications within the spirit and scope of the present disclosure will become apparent to those skilled in the art in light of the disclosure, and the scope of protection of the present disclosure should be defined by the appended claims. Throughout the specification and claims, the terms “one” and “the” include the recitation of “one or at least one” of the recited components or ingredients, unless the content clearly dictates otherwise. Furthermore, as used in this disclosure, the singular articles “a”, “an” and “the” include plural components or ingredients unless the context clearly dictates otherwise. Moreover, when used in the description and all the following claims, unless the content clearly specifies, the meaning of “wherein” can include “in it” and “on it”. The words used throughout the specification and claims have the ordinary meaning as commonly understood in the art to which this disclosure relates, in the context of this disclosure and in the particular context in which such words are used, unless otherwise indicated. Some terms used to describe this disclosure will be discussed below or elsewhere in this specification to provide additional guidance for practitioners in describing this disclosure. The use of examples anywhere throughout this specification, including examples of any words discussed herein, is only for illustration, and of course does not limit the scope and meaning of this disclosure or any exemplified words. Similarly, the present disclosure is not limited to the various embodiments set forth in this specification.

The words “approximately”, “about” or “nearly” used herein should generally mean that a given value or an error range is within 20%, preferably within 10%. Furthermore, the quantity provided herein can be approximate, which means that unless otherwise stated, it can be expressed by the words “approximately”, “about” or “nearly”. When a quantity, concentration, or other numerical value or parameter has a specified range, a preferred range, or tabular upper and lower ideal values, it is intended that all ranges from any upper and lower pair of values or desired values be specifically disclosed, regardless of whether ranges are separately disclosed. For example, if a certain length of the disclosure range is from X cm to Y cm, it should be considered that the disclosure length is H cm and H can be any real number between X and Y.

In addition, “electric (electrical) coupling” or “electric (electrical) connection” herein comprises any direct and indirect means of electrical connection. For example, if it is described herein that a first device is electrically coupled to a second device, it means that the first device can be directly connected to the second device or indirectly connected to the second device through other devices or connecting means. In addition, if transmission and provision of electrical signals are described, persons skilled in the art should understand that attenuation or other non-ideal changes may be accompanied in a transmission process of electrical signals, but if a source of electrical signal transmission or provision and a receiving end are not specifically described, the electrical signal shall be essentially regarded as the same signal. For example, if an electric signal S is transmitted (or supplied) from a terminal A of an electronic circuit to a terminal B of the electronic circuit, a voltage drop may occur across source and drain terminals of a transistor switch and/or a possible stray capacitor, but if the purpose of this design is to achieve some specific technical effects without deliberately using attenuation or other non-ideal changes generated during transmission, the electric signal S should be regarded as substantially the same signal at the terminal A and the terminal B of the electronic circuit.

It can be understood that the words "comprising/including", "having" and "containing" as used herein are inclusive words, meaning including but not limited to. In addition, any embodiment or claim of the present disclosure does not necessarily achieve all the purposes or advantages or features disclosed in the present disclosure. Furthermore, the abstract and title are only used to assist the search of patent documents, and are not used to limit the scope of the present disclosure.

The technical solutions in the embodiments of the present disclosure will be clearly and completely described below with reference to the drawings in the embodiments of the present disclosure. Obviously, the described embodiments are only part of the embodiments of the present invention, but not all of them. All other embodiments obtained by a person skilled in the art based on the embodiments of the present disclosure without creative efforts shall fall within the protection scope of the present invention. Furthermore, it should be understood that the specific embodiments described herein are merely illustrative and explanatory of the present disclosure and are not intended to be limiting thereof. In the present disclosure, unless stated to the contrary, the use of the terms of orientation such as "upper" and "lower" generally refer to upper and lower positions of the device in actual use or operation, particularly in the direction of the drawing figures, while "inner" and "outer" refer to the outline of the device.

In the present disclosure, the term "semiconductor structure" refers to the whole semiconductor structure formed in various steps of manufacturing the semiconductor device, including all layers or regions that have been formed. The term "laterally extending" refers to extending in a direction substantially perpendicular to the depth direction of the trench.

In the following description, numerous specific details of the present disclosure, such as structures, materials, dimensions, processing techniques and technologies of devices, are described to provide a more thorough understanding of the present disclosure. However, as will be understood by those skilled in the art, the present disclosure may be practiced without these specific details.

Unless otherwise specified below, various parts of the semiconductor device may be made of materials known to those skilled in the art. Semiconductor materials include, for example, group III-V semiconductors such as GaAs, InP, GaN, SiC, and group IV semiconductors such as Si, Ge. The gate conductor can be made of various materials capable of conducting electricity, for example, a metal layer, a doped polysilicon layer, or a stacked gate conductor including the metal layer and the doped polysilicon layer, or other conductive materials, such as TaC, TiN, TaSiN, HfSiN, TiSiN, TiCN, TaAlC, TiAlN, TaN, PtSix, $Ni_3Si$, Pt, Ru, W, and combinations of the various conductive materials. The gate dielectric may be made of $SiO_2$ or a material with a dielectric constant greater than that of $SiO_2$, including, for example, an oxide, nitride, oxynitride, silicate, aluminate and titanate. In addition, the gate dielectric may be formed of not only materials known to those skilled in the art but also materials developed in the future for the gate dielectric.

The present disclosure can be embodied in various forms, some of which are described below.

Figure 2:
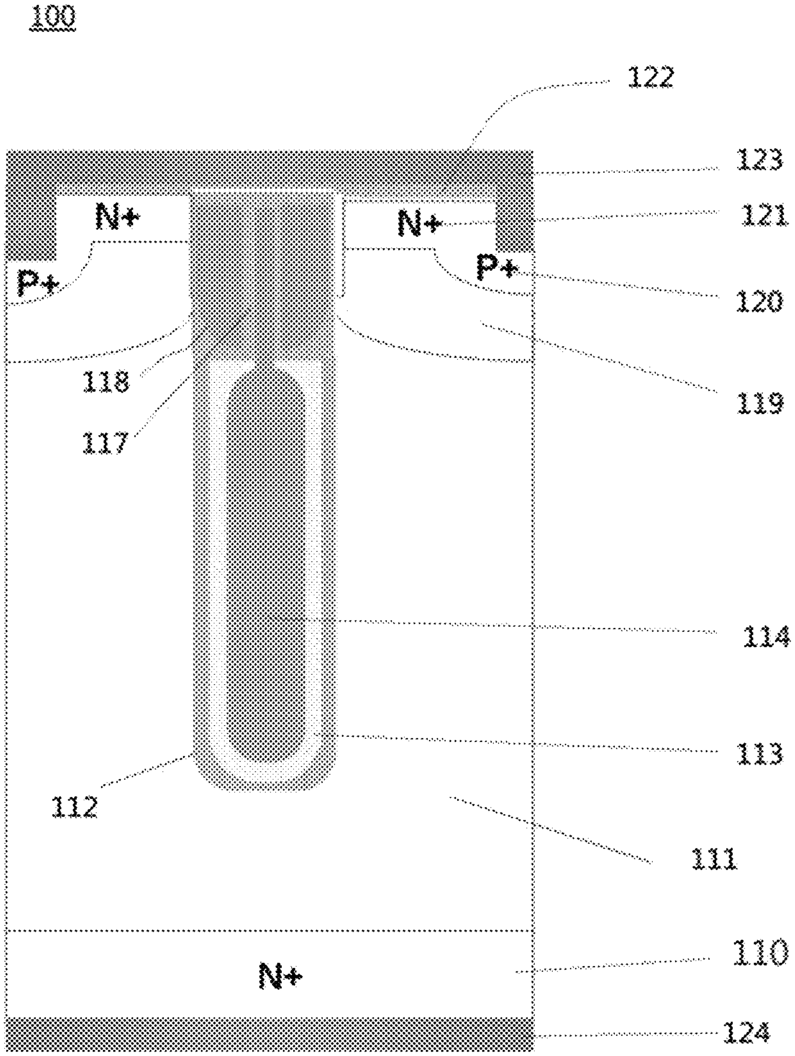
FIG. 2 shows a cross-sectional view of a trench-type MOSFET according to an embodiment of the present disclosure.

FIG. 2 shows a cross-sectional view of a trench-type MOSFET according to an embodiment of the present disclosure. In this embodiment, a semiconductor structure 100 (generally from top to bottom) comprises a source electrode (Source) 123, an interlayer dielectric layer 122, an N-type doped source region 121, a P-type doped body contact region 120, a body region (Body) 119, a gate dielectric layer 117, a gate conductor 118, a trench 112, a first dielectric layer 113, a shielding conductor 114, an epitaxial semiconductor layer (EPI) 111, a semiconductor substrate layer 110 and a drain electrode (Drain) 124. The semiconductor substrate layer 110 is, for example, composed of silicon, and is of a first dopant type (e.g., N+ doping type). The first dopant type is one of an N dopant type and a P dopant type, and a second dopant type is the other one of N dopant type and P dopant type. For convenience of explanation, in this embodiment, N dopant type is taken as an example of the first dopant type, that is, the semiconductor substrate layer 110 is N-type doped, but in some variations of this embodiment, the semiconductor substrate layer 110 may be P-type doped. In an example, in order to form an N-type epitaxial semiconductor layer/region, an N-type dopant (e.g., P, As) may be implanted in the epitaxial semiconductor layer/region; and in another example, in order to form a P-type epitaxial semiconductor layer/region, a P-type dopant (e.g., B) may be doped in the epitaxial semiconductor layer/region.

The epitaxial semiconductor layer 111 of the first dopant type is located on a surface of the semiconductor substrate layer 110 opposite to the drain electrode 124 (that is, on a first surface of the semiconductor substrate layer 110). The epitaxial semiconductor layer 111 is, for example, composed of silicon. The epitaxial semiconductor layer 111 may be a lightly doped layer relative to the semiconductor substrate layer 110. The drain electrode 124 is formed on a second surface of the semiconductor substrate layer 110. In some embodiments, a buffer layer (not shown) may be provided between the semiconductor substrate layer 110 and the epitaxial semiconductor layer 111, and a dopant type of the buffer layer is the same as that of the semiconductor substrate layer 110, so as to reduce instability of an interface between the semiconductor substrate layer 110 and the epitaxial semiconductor layer 111 due to substrate defects.

The trench 112 extends from an upper surface of the epitaxial semiconductor layer 111 into its interior, and the trench terminates in the epitaxial semiconductor layer 111. The first dielectric layer 113 and the shielding conductor 114 are formed in a lower portion of the trench 112, the first dielectric layer 113 is located on a lower-portion side wall and a bottom of the trench 112, and the first dielectric layer 113 separates the shielding conductor 114 from the epitaxial semiconductor layer 111.

The gate dielectric layer 117 and the gate conductor 118 are formed in an upper portion of the trench 112, the gate dielectric layer 117 is located on an upper-portion side wall of the trench 112 and separates the gate conductor 118 from the epitaxial semiconductor layer 111. The gate dielectric layer separates the shielding conductor 114 from the gate conductor 118. The first dielectric layer 113 may be composed of oxide or nitride, for example, silicon oxide or silicon nitride; and the shielding conductor 114 and the gate conductor 118 may be composed of polysilicon.

The body region (Body) 119 of the second dopant type is formed in an upper portion, which is adjacent to the trench 112, of the epitaxial semiconductor layer 111, wherein a junction depth of the body region 119 does not exceed a depth of the gate conductor 118 extending in the trench 112; the source region 121 of the first dopant type is formed in the body region 119; and the body contact region 120 of the second dopant type is formed in the body region 119. After the source region 121 is formed, the interlayer dielectric layer 122 is formed on the source region 121 and the gate conductor 118, at the same time a conductive channel, penetrating through the interlayer dielectric layer 122 and the source region 121 to reach the body contact region 120, is formed immediately adjacent to the source region 121, and the source electrode 123 is formed on the interlayer dielectric layer 122 and is connected to the body contact region 120 via the conductive channel. The interlayer dielectric layer 122 may be an oxide layer (for example, silicon oxide) with a certain thickness.

FIGS. 3*a* to 3*j* describe various stages of a method for manufacturing a trench-type MOSFET according to the present disclosure, which can roughly comprise following steps that will be described in detail in following paragraphs.

(a) Growing a thermal oxide layer, depositing a hard mask and performing etching to form a trench.

(b) Forming a side oxide layer by thermal oxidation and a dielectric layer by chemical vapor, and depositing polysilicon after a rapid thermal annealing process.

(c) Performing chemical mechanical planarization (CMP) and performing wet etching to an upper portion of the side oxide layer and dielectric layer.

(d) Depositing an oxide layer and smoothing the oxide layer.

(e) Performing etching to the oxide layer.

(f) Generating a gate dielectric layer and a gate conductor, and forming a gate poly after the chemical mechanical planarization.

(g) Implanting P-type impurities to form a P-type body region (Pbody).

(h) Implanting N-type impurities to form an N+ source region.

(i) Performing etching to the oxide layer and forming a through hole, performing P+ implantation and depositing a metal layer to form a contact.

j) Performing etching to the metal layer to form a gate contact region and a source electrode on a front surface, and coupling a field plate to the source electrode by an edge of the chip.

(k) Performing thinning, wherein a back metal layer forms a drain electrode on a back surface.

Figure 3A:
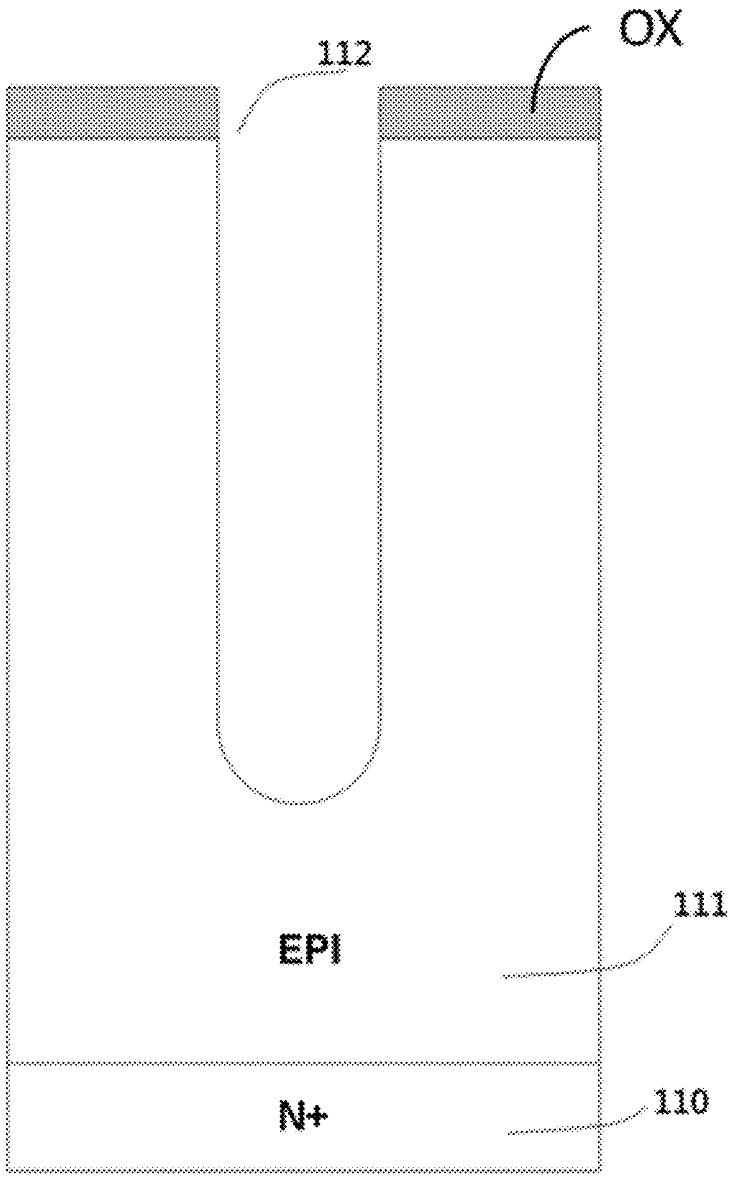
FIGS. 3*a* to 3*j* show cross-sectional views of various stages of a method for manufacturing a trench-type MOSFET according to an embodiment of the present disclosure.

With regard to step (a), as shown in FIG. 3*a*, first, the trench 112 is formed in a semiconductor structure, and extends from a surface to an interior of the semiconductor structure. Specifically, in the present disclosure, the semiconductor structure comprises a semiconductor substrate layer 110 and an epitaxial semiconductor layer 111 on the semiconductor substrate layer 110; and an oxide layer OX is formed on the epitaxial semiconductor layer 111. Then, a photoresist layer is formed on the oxide layer and then an etching process is performed. The etching process can be achieved by dry etching, for example, ion milling etching, plasma etching, reactive ion etching, laser ablation, or by selective wet etching using an etching solution, and the etching process is performed downward from an opening in the photoresist mask to form an opening in the oxide layer, thereby patterning the oxide layer into the hard mask. Due to etching selection, the above etching process can be stopped at an interior of the epitaxial semiconductor layer 111. By using the hard mask, the epitaxial semiconductor layer 111 is further etched by the above-mentioned known etching process, and the trench 112 is further formed in the epitaxial semiconductor layer 111. The trench 112 extends from the upper surface of the epitaxial semiconductor layer 111 into the epitaxial semiconductor layer 111. For example, by controlling etching time, a depth of the trench 112 can be controlled. As shown in FIG. 3*a*, the trench 112 terminates in the epitaxial semiconductor layer 111.

Figure 3B:
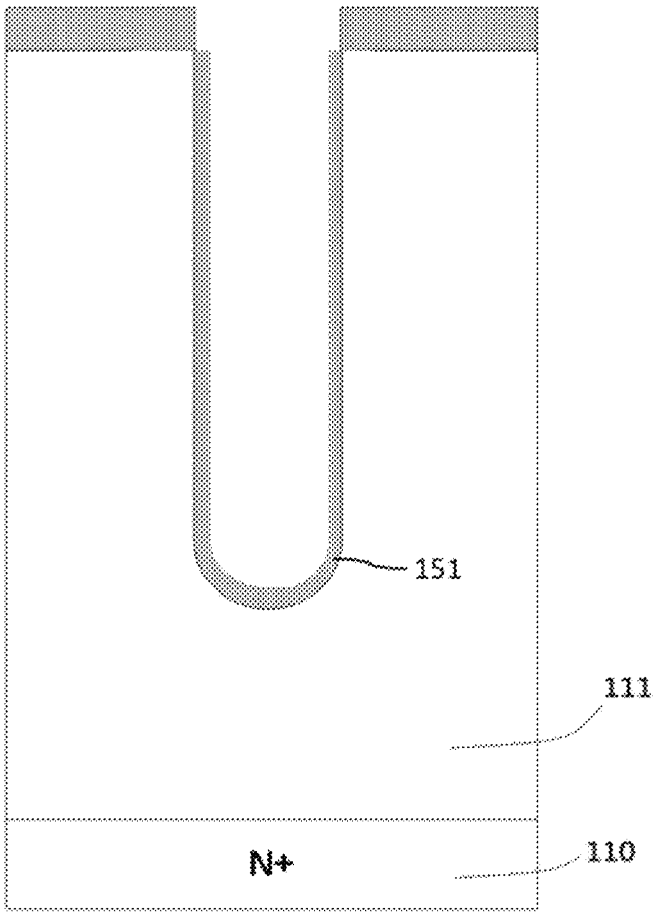
Figure 3C:
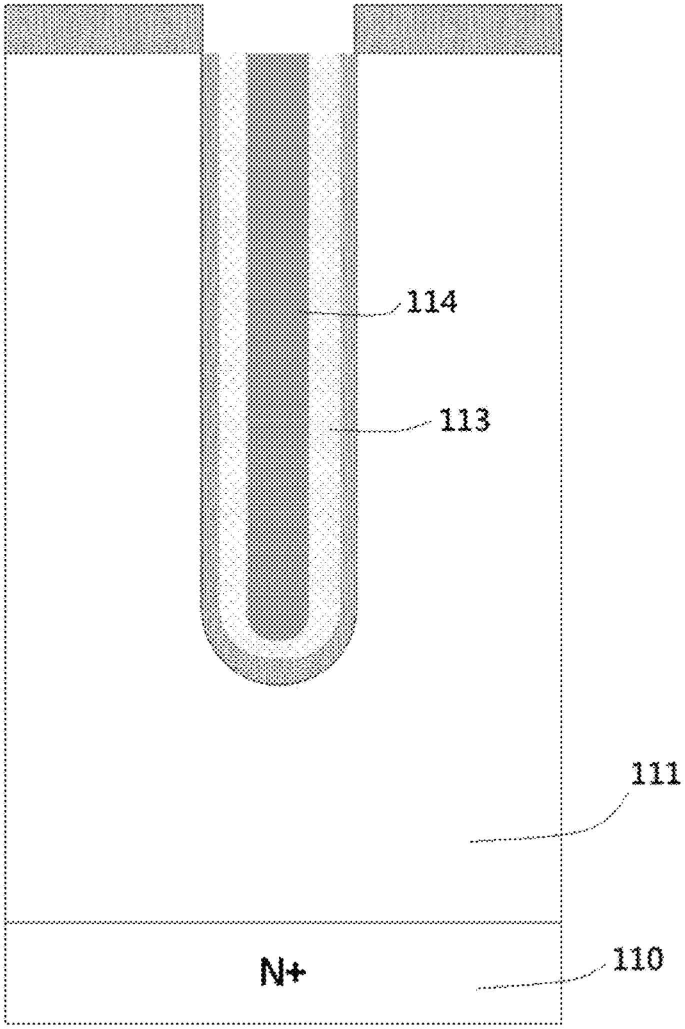

With regard to step (b), first of all, as shown in FIGS. 3*b* and 3*c*, according to the present disclosure, the side oxide layer 151 is formed by thermal oxidation and the dielectric layer 113 is formed by chemical vapor deposition, and a shielding conductor 114 is formed by injecting polycrystalline silicon.

Figure 3D:
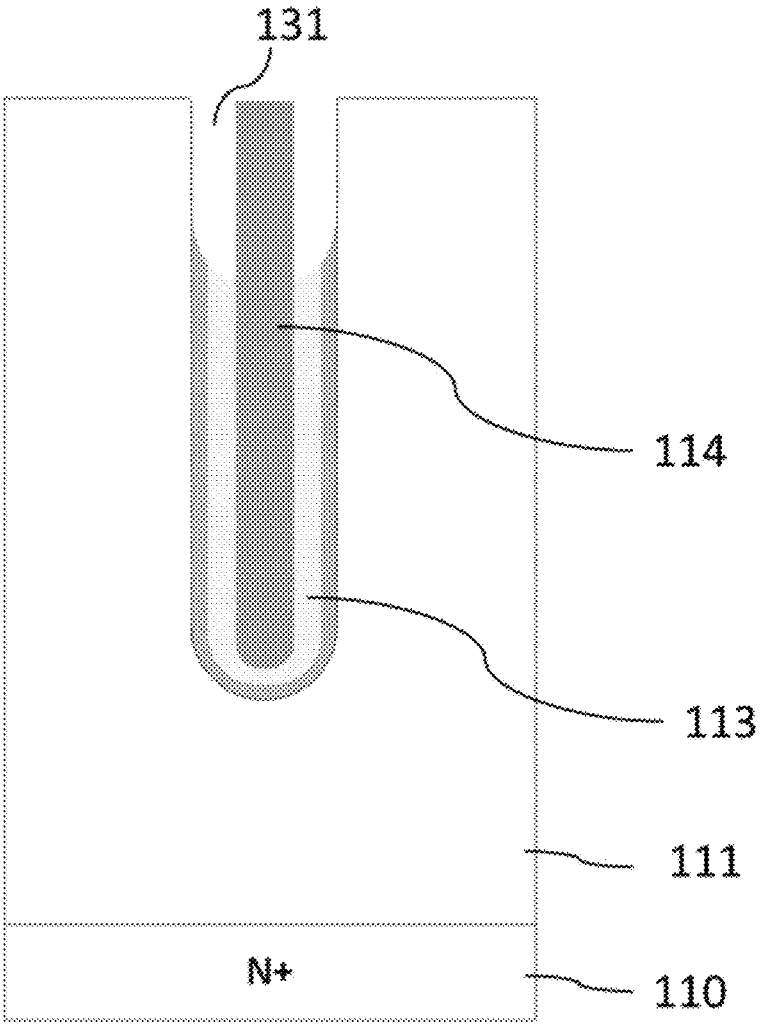

With regard to step (c), as shown in FIG. 3*d*, chemical mechanical planarization is performed to remove the hard mask, so that a top end of the side oxide layer 115 and a top end of the dielectric layer 113 are exposed. Then, an upper portion of the side oxide layer 115 and the dielectric layer 113 are wet etched.

Figure 3E:
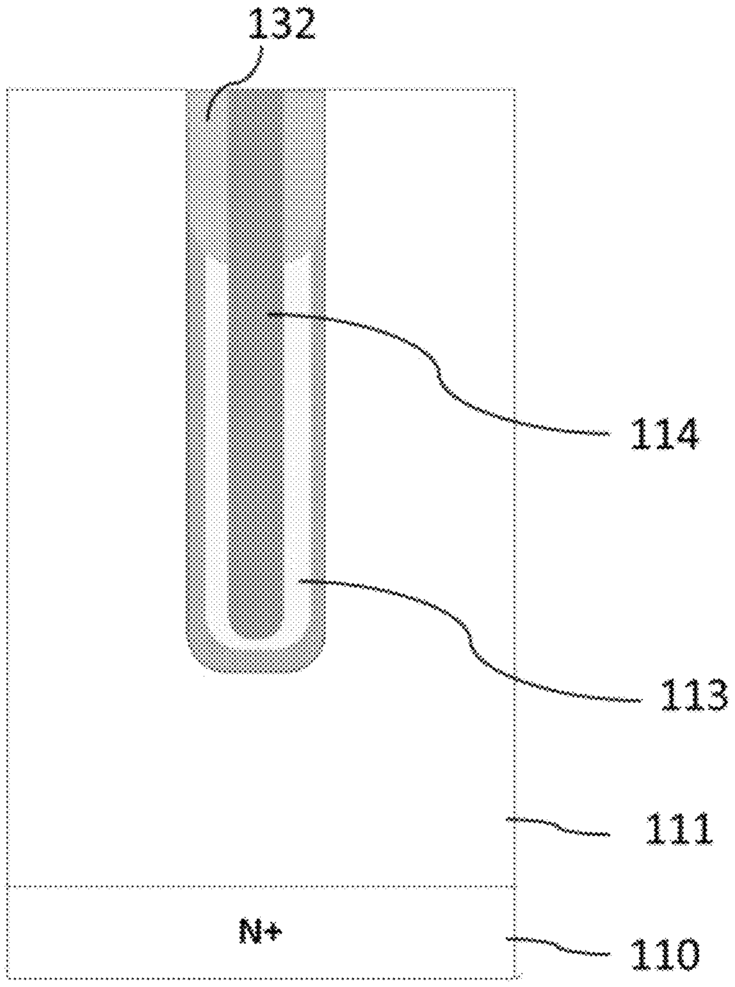

With regard to step (d), as shown in FIG. 3*e*, an oxide layer 132 is deposited and a surface thereof is smoothed.

Figure 3F:
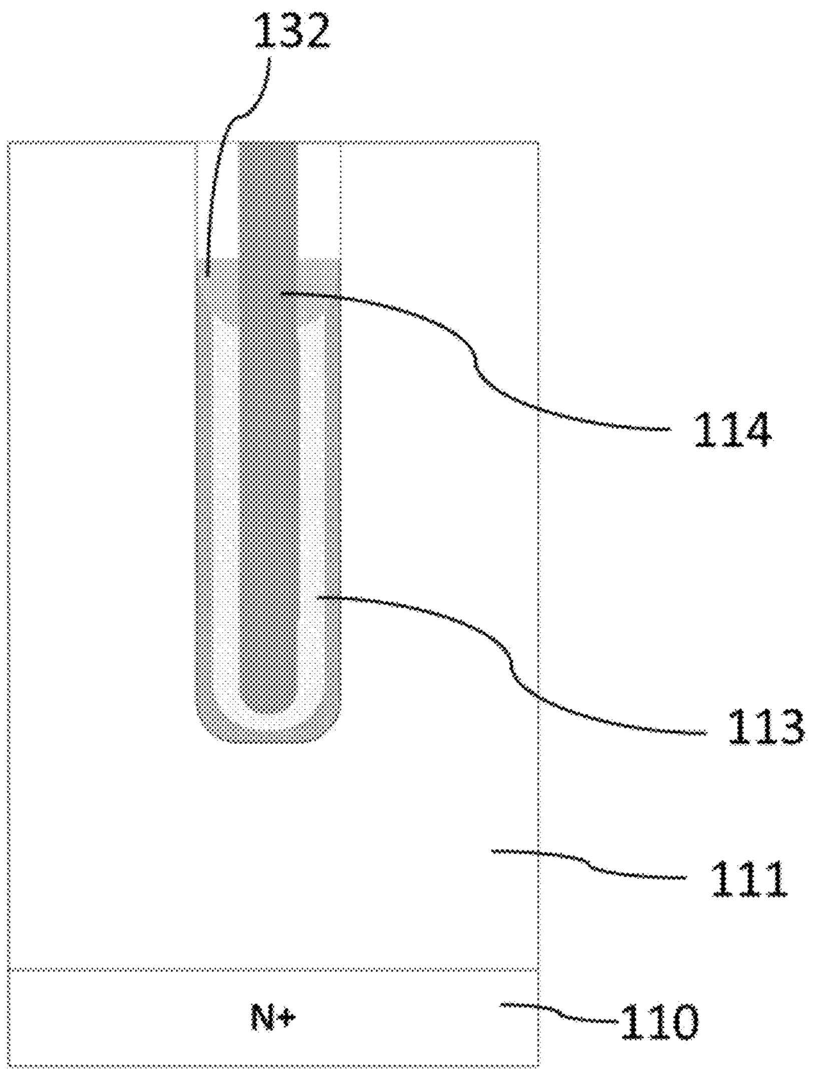

With regard to step (e), as shown in FIG. 3*f*, the oxide layer 132 is etched to a level lower than that of the shielding conductor 114.

Figure 3G:
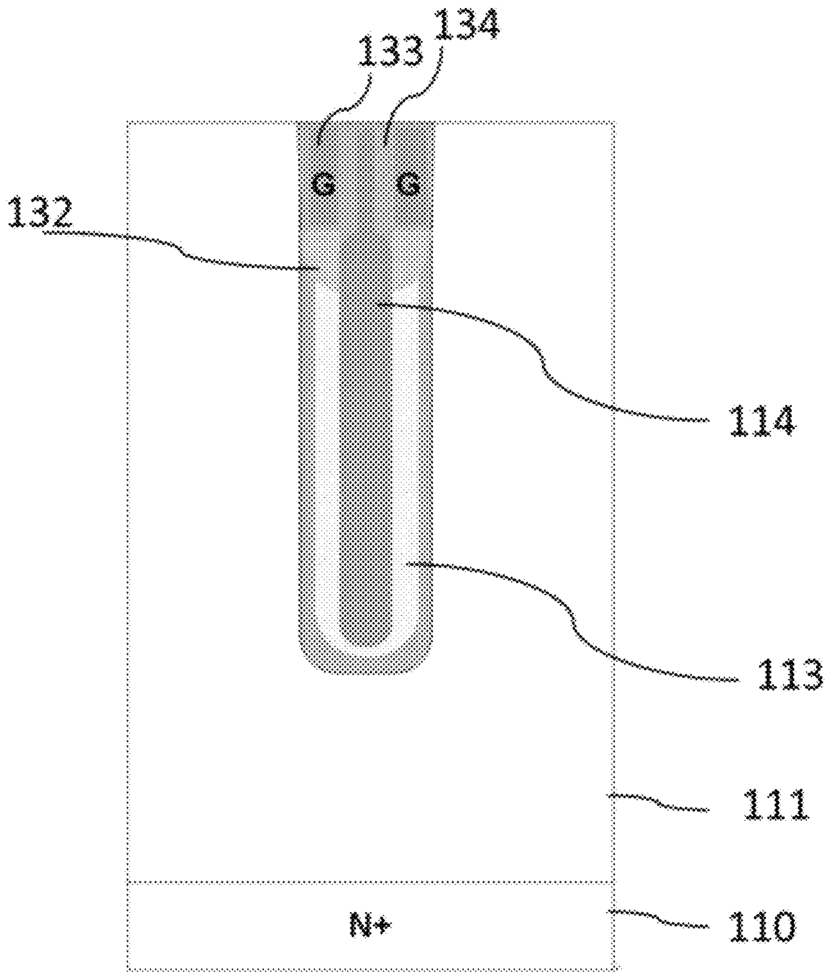

With regard to step (f), as shown in FIG. 3*g*, the gate dielectric layer 134 is formed, polysilicon 133 is deposited, and the gate poly (denoted as G) is formed after the chemical mechanical planarization. In some embodiments, polysilicon is filled in the trench covered with the gate dielectric layer 134 by low-pressure chemical vapor deposition to form the gate poly G (gate conductor 133) which comprises a first portion located in the trench and a second portion located on the upper surface. Then, back etching or chemical mechanical planarization is performed to remove the first portion of the gate conductor located on the upper surface of the epitaxial semiconductor layer, so that an upper end of the gate poly G terminates at an opening of the trench. Optionally, a conductor layer forming the gate conductor 133 can be selectively removed relative to the epitaxial semiconductor layer 111, and the conductor layer is etched back so that the gate poly G in the trench is located at the upper surface of the epitaxial semiconductor layer. The gate dielectric layer 134 insulates the shielding conductor 114 and the gate poly G from each other, and the gate dielectric layer 134 has certain quality and thickness to support potential difference that may exist between the shielding conductor 114 and the gate poly G. For example, a thickness range of the gate dielectric layer can be selected from 800A-1500A.

Figure 3H:
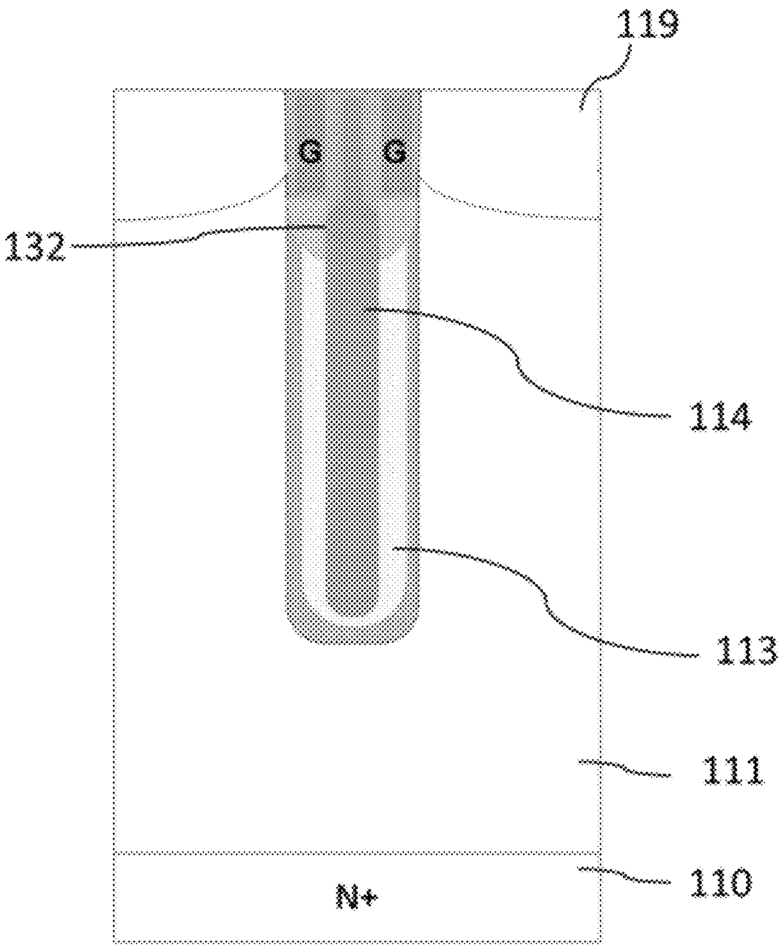
Figure 3I:
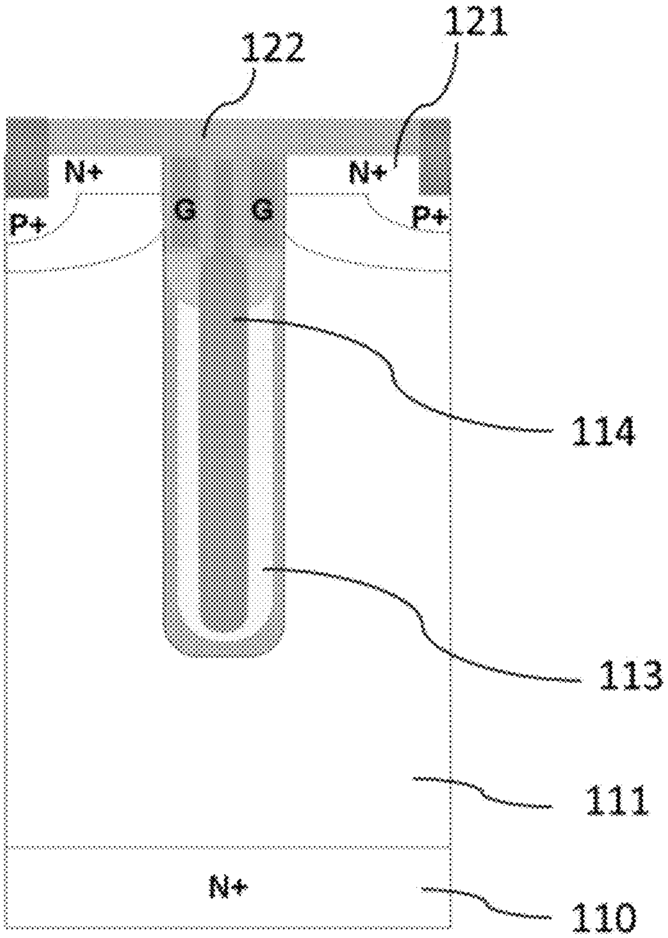

Then, as shown in FIG. 3*h*, by using conventional body implantation, P-type impurities are implanted to form the body region (Body) 119 of the second dopant type in an upper portion, which is adjacent to the trench, of the epitaxial semiconductor layer 111. Further, with regard to step (h), as shown in FIG. 3*i*, N-type impurities are implanted to form a source region (N+ source region) 121 of N dopant type; then, step (i) is subsequentially performed to etch the oxide layer and form a through hole, and then P+ implantation and metal layer deposition are performed to form the body contact region 120, and the source region 121 of the first dopant type (e.g., N type) is formed in the body region 119. The body region 119 of the second dopant type and the epitaxial semiconductor layer 111 of the first dopant type are opposite in type. By controlling parameters of ion implantation, for example, implantation energy and dosage, required depth and doping concentration can be achieved, and the depth of the body region 119 does not exceed an extension depth of the gate conductor 118 in the trench. With an additional photoresist mask, a lateral extension area of the body region 111 and the source region 113 can be controlled. Preferably, the body region 119 and the source region 121 are respectively adjacent to the trench and separated by the gate dielectric 117 and the gate conductor 118.

Figure 3J:
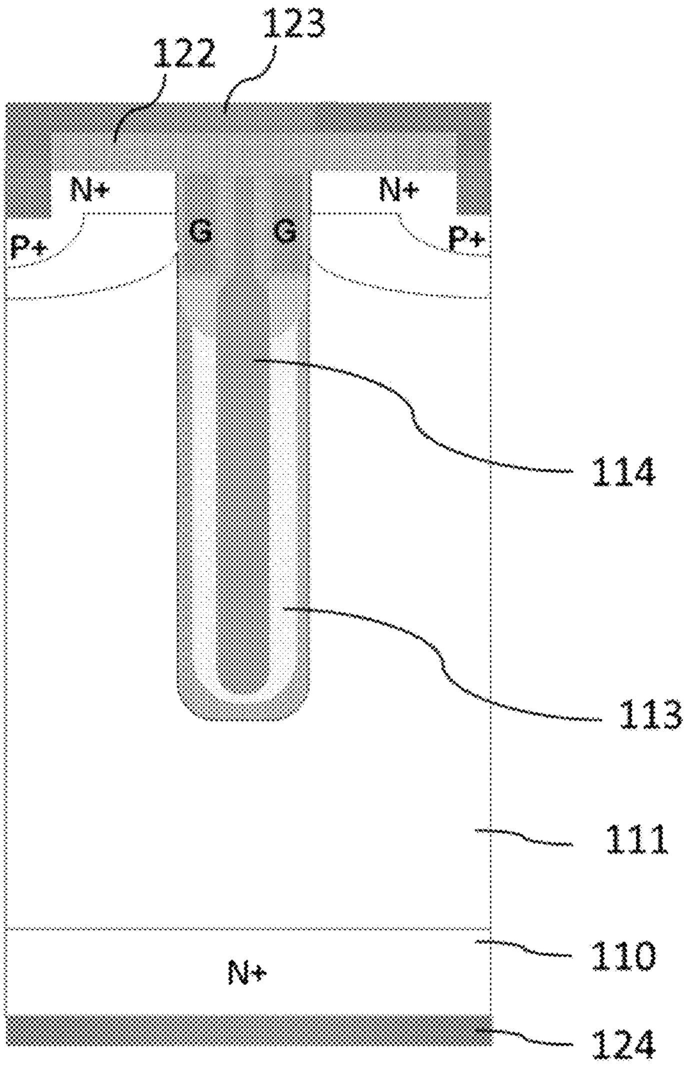

Subsequently, with regard to step (j), as shown in FIG. 3*j*, the metal layer is etched to form the source electrode 123 on a front surface and the interlayer dielectric layer 122 located above the source region 121 by the above-mentioned known deposition process, while the edge of the chip couples the field plate to the source electrode 123, wherein if necessary, chemical mechanical planarization can be further performed to obtain a flat surface. The interlayer dielectric layer 122 covers top surfaces of the source region 121 and the gate conductor 118, a portion, which is located at the upper surface of the epitaxial semiconductor layer, of the gate oxide layer may be selectively removed by etching after the source region is formed, or may be conformal with the interlayer dielectric layer 122 and located on the source region 121 without being removed. Through the above-mentioned known etching process and ion implantation process, the body contact region 120 of the second dopant type is formed in the body region 119. Through the above-mentioned known etching process, a conductive channel penetrating through the interlayer dielectric layer 122 and the source region 121 to reach the body contact region 120 is formed, and a source electrode 123 is formed on the interlayer dielectric layer 114, and the source electrode 123 is connected to the body contact region 120 via the conductive channel.

Then, as shown in FIG. 3*j*, in step (k), through the above-mentioned known deposition process, the drain electrode (Drain) 124 is formed on the second surface of the semiconductor substrate layer 110 thinned by a thinning technique.

In the embodiment described above, the source electrode 123, the gate conductor 118, the shielding conductor 114, and the drain electrode 124 may be respectively formed of conductive material, including metal materials such as an aluminum alloy or copper.

According to the disclosure, in view of process deficiencies of the prior art, morphology of the gate poly can be improved and Figure of Merit (FOM) of the device can be optimized by depositing and smoothing the oxide layer after the side oxide layer is wet etched. FOM plays an important role in measuring product performance, and the higher the FOM value of a product is, the better the performance is.

To sum up, the present disclosure effectively solves the problems in the prior art through above novel solutions, and in addition, embodiments of the present disclosure are provided without increasing too much cost, so as to meet economic efficiency requirement.

In the above embodiments, the descriptions of various embodiment have their own emphasis, for those parts that are not detailed in one embodiment, please refer to the relevant descriptions of other embodiments. The above-described embodiments are only part of the embodiments of the present disclosure, but not all of them. Based on the embodiments of the present disclosure, besides the design of the embodiments consistent with the implementations of the present disclosure mentioned in the embodiments of the present disclosure, all other embodiments obtained by those skilled in the art without making creative efforts are within the protection scope of the present disclosure.

It is to be explained that the relationship terms, such as "first" and "second", are used herein only for distinguishing one entity or operation from another entity or operation but do not necessarily require or imply that there exists any actual relationship or sequence of this sort between these entities or operations. Also, the terms "comprise", "comprising" or any other variation thereof, are intended to cover a non-exclusive inclusion, such that a process, method, article, or apparatus that comprises a list of elements not only include those elements, but also include other elements not expressly listed or elements inherent to such process, method, article, or apparatus. In the case of no more limitations, the element limited by the sentence "comprising a . . . " does not exclude that there exists another same element in the process, method, article or device comprising the element.

According to the embodiments of the present disclosure as described above, these embodiments do not describe all the details at large, nor do they limit the present disclosure to the specific embodiments. Obviously, many modifications and variations are possible in light of the above. These embodiments have been chosen and described in detail by the specification to explain the principles and embodiments of the present disclosure so that those skilled in the art can make good use of the present disclosure and the modified use based on the present disclosure. The disclosure is to be limited only by the scope of the appended claims and the appended claims and equivalents thereof.

The embodiments of the present disclosure are described in detail above, and the principle and the implementation of the present disclosure are explained herein by applying specific examples, and the description of the above embodiments is only used to help understanding the technical solution and the core idea of the present disclosure. It should be understood by those of ordinary skill in the art that modifications may be made to the technical solutions described in the foregoing embodiments, or equivalents may be substituted for some of the technical features thereof, and these modifications or substitutions do not make the essence of the corresponding technical solutions deviate from the scope of the technical solutions of the embodiments of the present disclosure.

To sum up, although the present disclosure has been disclosed in terms of preferred embodiments, the above preferred embodiments are not intended to limit the present invention, and those of ordinary skill in the art can make various changes and embellishments without departing from the spirit and scope of the present invention, hence, the scope of protection of the present invention is subject to the scope defined by the claims.

What is claimed is:

1. A method for manufacturing a trench-type MOSFET, comprising:

providing a semiconductor structure, depositing a hard mask and performing etching to form a trench extending from an upper surface of the semiconductor structure to an interior of the semiconductor structure;

forming a side oxide layer and a dielectric layer in the trench;

forming a shielding conductor in the trench, wherein the side oxide layer and the dielectric layer separate the shielding conductor from the semiconductor structure;

removing the hard mask;

performing wet etching to remove a portion of the side oxide layer and a portion of the dielectric layer, which are located at an upper portion of the trench, thereby exposing a first portion of a sidewall of the shielding conductor, wherein the first portion of the sidewall of the shielding conductor extends from the upper surface of the semiconductor structure to a first depth, the first portion of the sidewall includes a second portion of a sidewall of the shielding conductor extending from the upper surface of the semiconductor structure to a second depth, and the second depth is less than the first depth;

depositing an oxide layer into the trench, wherein the oxide layer covers the side oxide layer and dielectric layer, and the oxide layer is adjacent to the shielding conductor;

etching the oxide layer so as to make an upper surface of the oxide layer lower than an upper surface of the shielding conductor, thereby re-exposing the second portion of the sidewall of the shielding conductor;

forming a gate dielectric layer and a gate conductor on the oxide layer in the trench, wherein the gate dielectric layer is located on an upper-portion side wall of the trench and separates the gate conductor from the semiconductor structure; and forming a body region and a source region in the semiconductor structure, and forming a drain electrode of the trench-type MOSFET.

2. The method according to claim 1, wherein the step of forming the side oxide layer in the trench comprises:

forming the side oxide layer by thermal oxidation and forming the dielectric layer by chemical vapor deposition.

3. The method according to claim 1, wherein before the step of forming the shielding conductor in the trench, the method further comprises: after forming the side oxide layer and the dielectric layer, performing a rapid thermal annealing process, and then depositing polysilicon as the shielding conductor.

4. The method according to claim 1, wherein the step of removing the hard mask comprises:

performing chemical mechanical planarization to remove the hard mask.

5. The method according to claim 1, wherein the semiconductor structure comprises a semiconductor substrate layer and an epitaxial semiconductor layer on the semiconductor substrate layer, wherein the trench is located in the epitaxial semiconductor layer.

6. The method according to claim 1, wherein the shielding conductor and the gate conductor are respectively polysilicon layers formed by low-pressure chemical vapor deposition.

7. The method according to claim 1, wherein the gate dielectric layer is an oxide layer formed by thermal oxidation.

8. The method according to claim 1, wherein, the source region is formed in the body region and is of a first dopant type;

the body region is formed in an upper portion, which is adjacent to the trench, of the semiconductor structure and is of a second dopant type, wherein the second dopant type is opposite to the first dopant type, wherein the first dopant type is one of N type and P type, and the second dopant type is the other one of N type and P type; and the drain electrode is formed on a second surface of the semiconductor structure, and the second surface and the upper surface of the semiconductor structure are opposite to each other.

9. The method according to claim 8, wherein after forming the source region, the method further comprises:

forming an interlayer dielectric layer on the source region; and forming a source electrode on the interlayer dielectric layer.

10. The method according to claim 9, wherein before forming the source electrode, the method further comprises:

forming, in the body region, a body contact region of the second dopant type, and forming a conductive channel penetrating through the interlayer dielectric layer and the source region to reach the body contact region, wherein the source electrode is connected to the body contact region via the conductive channel.

11. The method according to claim 1, wherein the portion of the side oxide layer and the portion of the dielectric layer are simultaneously removed by the wet etching.

12. The method according to claim 1, wherein an upper portion of the shielding conductor has a thinner width than that of an intermediate portion of the shielding conductor, the upper portion of the shielding conductor has a side wall directly covered by the gate dielectric layer, the gate conductor is located between the side wall of the upper portion of the shielding conductor and the body region, the intermediate portion of the shielding conductor has a side wall directly covered by the oxide layer and is located below the gate conductor.

* * * * *